United States Patent
Ishii et al.

(10) Patent No.: US 8,138,427 B2
(45) Date of Patent: Mar. 20, 2012

(54) PRINTED CIRCUIT BOARD AND METHOD OF MANUFACTURING THE SAME

(75) Inventors: Jun Ishii, Ibaraki (JP); Toshiki Naitou, Ibaraki (JP); Mitsuru Honjo, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 328 days.

(21) Appl. No.: 12/611,985

(22) Filed: Nov. 4, 2009

(65) Prior Publication Data

US 2010/0116537 A1    May 13, 2010

Related U.S. Application Data

(60) Provisional application No. 61/119,388, filed on Dec. 3, 2008.

(30) Foreign Application Priority Data

Nov. 10, 2008    (JP) .................................. 2008-287773

(51) Int. Cl.
H05K 1/11    (2006.01)

(52) U.S. Cl. ..................... 174/261; 174/254; 360/245.9; 29/846

(58) Field of Classification Search ................ 360/245.9; 29/846

See application file for complete search history.

(56) References Cited

U.S. PATENT DOCUMENTS

| | | | |
|---|---|---|---|
| 5,858,518 A | 1/1999 | Omote et al. | |
| 6,096,482 A | 8/2000 | Omote et al. | |
| 6,100,582 A | 8/2000 | Omote et al. | |
| 6,388,840 B1 | 5/2002 | Ohwe | |
| 6,392,148 B1 * | 5/2002 | Ueno et al. | 174/72 A |
| 6,424,499 B1 * | 7/2002 | Balakrishnan et al. | 360/245.9 |
| 6,480,359 B1 | 11/2002 | Dunn et al. | |
| 6,894,874 B2 * | 5/2005 | Maruyama et al. | 360/245.9 |
| 2001/0016975 A1 * | 8/2001 | Amemiya et al. | 29/603.03 |
| 2002/0100609 A1 | 8/2002 | Ookawa et al. | |
| 2003/0053258 A1 | 3/2003 | Dunn et al. | |
| 2004/0070884 A1 | 4/2004 | Someya et al. | |
| 2004/0084212 A1 | 5/2004 | Miller | |
| 2004/0228100 A1 | 11/2004 | Wright | |
| 2004/0252413 A1 | 12/2004 | Nishiyama | |
| 2006/0023435 A1 | 2/2006 | Ooyabu et al. | |
| 2007/0227764 A1 | 10/2007 | Honjo | |

FOREIGN PATENT DOCUMENTS

| | | |
|---|---|---|
| EP | 1622434 A1 | 2/2006 |
| GB | 2269941 A * | 2/1994 |
| JP | 10-012983 A | 1/1998 |
| JP | 2004-133988 A | 4/2004 |
| WO | 01/86641 A | 11/2001 |

* cited by examiner

*Primary Examiner* — Ishwarbhai Patel
(74) *Attorney, Agent, or Firm* — Panitch Schwarze Belisario & Nadel LLP

(57) ABSTRACT

A printed circuit board and method of manufacturing the printed circuit board, including a first and second write wiring patterns, an end of a first line and an end of a second line of the first write wiring pattern are arranged on both sides of a third line of a second write wiring pattern. Circular connection portions are provided at the ends of the first line and the second line. Through holes are formed in portions of a cover insulating layer above the connection portions, respectively. First connecting layers made of copper, for example, are formed to fill the through holes of the cover insulating layer. A substantially rectangular second connecting layer made of copper, for example, is formed to integrally cover upper ends of the connecting layers. This causes the first and second lines to be electrically connected to each other through the first and second connecting layers.

4 Claims, 11 Drawing Sheets

F I G. 3
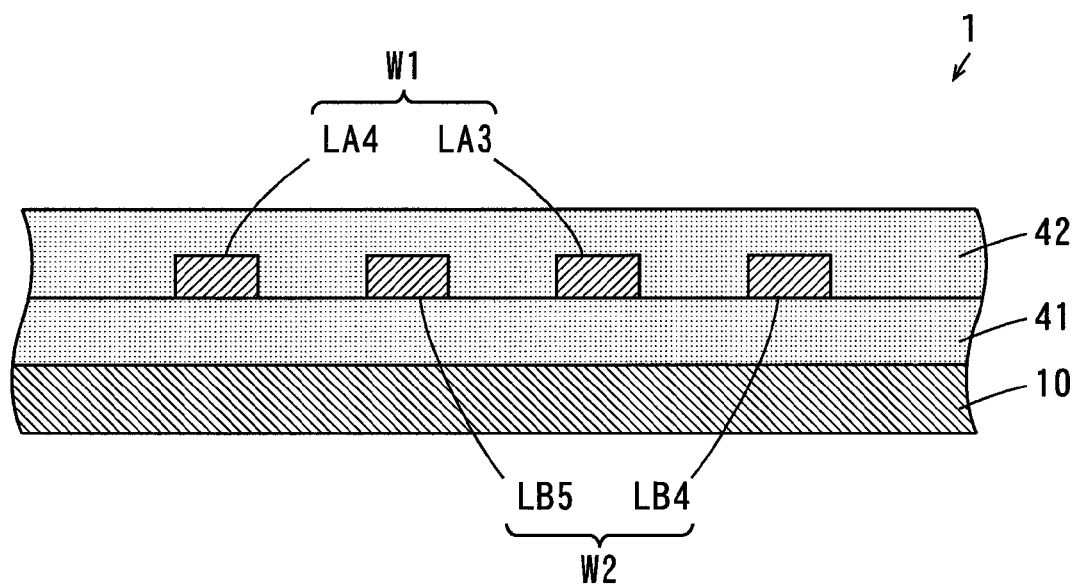

F I G. 6
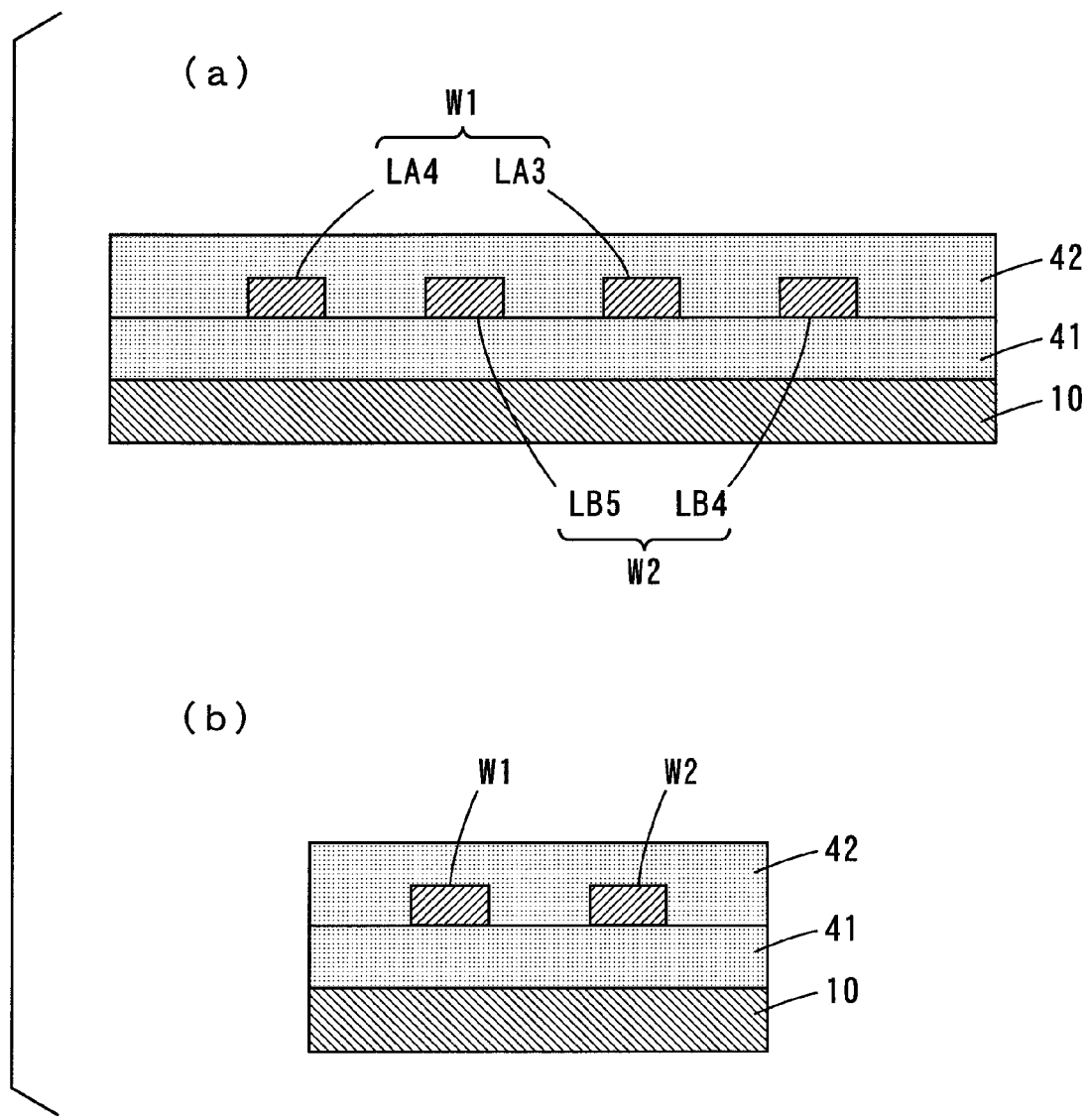

(a) TRANSMISSION REGION

INTERSECTION REGION (b) TRANSMISSION REGION

INTERSECTION REGION (c) TRANSMISSION REGION

INTERSECTION REGION

PRINTED CIRCUIT BOARD AND METHOD OF MANUFACTURING THE SAME

BACKGROUND OF THE INVENTION

1. Field of the Invention

The present invention relates to a printed circuit board and a method of manufacturing the same.

2. Description of the Background Art

Actuators are used in drives such as hard disk drives. Such an actuator includes an arm arranged rotatably with respect to a rotation shaft and a suspension board used for a magnetic head that is attached to the arm. The suspension board is a printed circuit board for aligning the magnetic head with a desired track of a magnetic disk.

FIG. 11 is a vertical sectional view of a conventional suspension board (see JP 2004-133988 A, for example).

In the suspension board 910, a first insulating layer 904 is formed on a metal substrate 902. A write wiring trace W12 and a read wiring trace R12 are formed to be spaced apart from each other by a distance L1 on the first insulating layer 904.

A second insulating layer 905 is formed on the first insulating layer 904 to cover the write wiring trace W12 and the read wiring trace R12. On the second insulating layer 905, a write wiring trace W11 is formed at a position above the read wiring trace R12, and a read wiring trace R11 is formed at a position above the write wiring trace W12.

Each of the distance between the read wiring trace R11 and the write wiring trace W12 positioned one above the other and the distance between the read wiring trace R12 and the write wiring trace W11 positioned one above the other is L2.

In the suspension board 910 having the foregoing configuration, the distance between the write wiring trace W11 and the read wiring trace R11 and the distance between the write wiring trace W12 and the read wiring trace R11 are substantially equal to the distance between the write wiring trace W11 and the read wiring trace R12 and the distance between the write wiring trace W12 and the read wiring trace R12, respectively. Accordingly, it is considered that the magnitude of induced electromotive forces generated in the read wiring traces R11, R12 are substantially equal when the write current flows through the write wiring traces W11, W12. This allows crosstalk between the write wiring traces W11, W12 and the read wiring traces R11, R12 to be reduced.

Recently, recording densities of magnetic disks have been improved and a PMR (Perpendicular Magnetic Recording) system has been introduced, resulting in a growing need for larger currents for writing. Thus, impedances of wiring traces of magnetic heads and suspension boards need to be reduced.

SUMMARY OF THE INVENTION

An object of the present invention is to provide a printed circuit board with reduced characteristic impedances of wiring patterns and a method of manufacturing the same.

(1) According to an aspect of the present invention, a printed circuit board includes a base insulating layer, first and second wiring patterns that are formed on the base insulating layer and constitute a signal line pair, a cover insulating layer formed on the base insulating layer to cover at least part of the first and second wiring patterns, and a connecting layer provided on the cover insulating layer, wherein the first wiring pattern has first and second lines, the second wiring pattern has third and fourth lines, one ends of the first and second lines are electrically connected to each other and the other ends of the first and second lines are electrically connected to each other, one ends of the third and fourth lines are electrically connected to each other and the other ends of the third and fourth lines are electrically connected to each other, the first and second lines of the first wiring pattern and the third and fourth lines of the second wiring pattern are arranged such that any one of the first and second lines is located between the third and fourth lines and any one of the third and fourth lines is located between the first and second lines, a first intersection region in which the first or second line of the first wiring pattern and the third or fourth line of the second wiring pattern intersect with each other is provided, a second intersection region in which the first or second line of the first wiring pattern and the third or fourth line of the second wiring pattern intersect with each other is provided, a portion of the first or second line of the first wiring pattern positioned in the first intersection region is divided, a portion of the third or fourth line of the second wiring pattern positioned in the first intersection region is arranged on the base insulating layer to pass through a portion in between divided portions of the first or second line of the first wiring pattern, the cover insulating layer includes a first cover portion that has first and second through holes and is provided to cover the first and second wiring patterns in the first intersection region, the connecting layer includes a first connecting layer provided on the first cover portion, one of the divided portions of the first or second line of the first wiring pattern is electrically connected to the first connecting layer through the first through hole of the first cover portion, and the other of the divided portions of the first or second line of the first wiring pattern is electrically connected to the first connecting layer through the second through hole of the first cover portion.

In the printed circuit board, the first and second lines of the first wiring pattern and the third and fourth lines of the second wiring pattern are arranged such that any one of the first and second lines is located between the third and fourth lines and any one of the third and fourth lines is located between the first and second lines. In this case, three side surfaces out of one side surface and the other side surface of the first line and one side surface and the other side surface of the second line are opposite to three side surfaces out of one side surface and the other side surface of the third line and one side surface and the other side surface of the fourth line, respectively. This increases an area in which the first wiring pattern and the second wiring pattern are opposite to each other, thus increasing capacitances of the first and second wiring patterns. This results in reduced characteristic impedances of the first and second wiring patterns.

The portion of the first or second line of the first wiring pattern is divided, and the portion of the third or fourth line of the second wiring pattern is arranged to pass through the portion in between the divided portions of the first or second line of the first wiring pattern in the first intersection region.

The one of the divided portions of the first or second line of the first wiring pattern is electrically connected to the first connecting layer through the first through hole of the cover insulating layer, and the other is electrically connected to the first connecting layer through the second through hole of the cover insulating layer. In this case, the divided portions of the first or second line of the first wiring pattern are electrically connected to each other through the first connecting layer.

This allows electrical connection of the first wiring pattern to be ensured and the first and second lines of the first wiring pattern and the third and fourth lines of the second wiring pattern to be arranged such that any one of the first and second lines is located between the third and fourth lines and any one of the third and fourth lines is located between the first and second lines with a simple configuration. Accordingly, the characteristic impedances of the first and second wiring patterns can be easily reduced at low cost.

(2) The cover insulating layer may include a second cover portion that has third and fourth through holes and is provided to cover the first and second wiring patterns in the second intersection region, the connecting layer may further include a second connecting layer provided on the second cover portion, a portion of the third or fourth line of the second wiring pattern positioned in the second intersection region may be divided, a portion of the first or second line of the first wiring pattern positioned in the second intersection region may be arranged on the base insulating layer to pass through a portion in between divided portions of the third or fourth line of the second wiring pattern, one of the divided portions of the third or fourth line of the second wiring pattern may be electrically connected to the second connecting layer through the third through hole of the second cover portion, and the other of the divided portions of the third or fourth line of the second wiring pattern may be electrically connected to the second connecting layer through the fourth through hole of the second cover portion.

In this case, the portion of the third or fourth line of the second wiring pattern is divided, and the portion of the first or second line of the first wiring pattern is arranged to pass through the portion in between the divided portions of the third or fourth line of the second wiring pattern in the second intersection region.

One of the divided portions of the third or fourth line of the second wiring pattern is electrically connected to the second connecting layer through the third through hole of the second cover portion, and the other is electrically connected to the second connecting layer through the fourth through hole of the second cover portion. In this case, the divided portions of the third or fourth line of the second wiring pattern are electrically connected to each other through the second connecting layer.

Accordingly, the divided portions of the first or second line of the first wiring pattern are connected to each other and the divided portions of the third or fourth line of the second wiring pattern are connected to each other with the same configuration in the first and second intersection regions. Thus, a balance between the first wiring pattern and the second wiring pattern is ensured. This results in good transmission characteristics in the first wiring pattern and the second wiring pattern.

(3) The printed circuit board may further include a fifth line branched from the one end of the first line or the one end of the second line, a sixth line branched from the other end of the first line or the other end of the second line, a seventh line branched from the one end of the third line or the one end of the fourth line, and an eighth line branched from the other end of the third line or the other end of the fourth line, wherein a width of each of the fifth line and the sixth line may be obtained by adding a width of the first line and a width of the second line, and a width of each of the seventh line and the eighth line may be obtained by adding a width of the third line and a width of the fourth line.

In this case, the integrated characteristic impedances of the first and second lines are equal to the characteristic impedance of each of the fifth and sixth lines in the first wiring pattern. Similarly, the integrated characteristic impedances of the third and fourth lines are equal to the characteristic impedance of each of the seventh and eighth lines in the second wiring pattern. This reduces transmission loss in the first and second wiring patterns.

(4) According to another aspect of the present invention, a method of manufacturing a printed circuit board includes the steps of forming first and second wiring patterns constituting a signal line pair on a base insulating layer, forming a cover insulating layer having first and second through holes on the base insulating layer to cover the first and second wiring patterns in a first intersection region, and forming a connecting layer on the cover insulating layer, wherein the step of forming the first and second wiring patterns includes the step of forming the first and second wiring patterns on the base insulating layer such that the first wiring pattern is composed of first and second lines and the second wiring pattern is composed of third and fourth lines, the first and second lines of the first wiring pattern and the third and fourth lines of the second wiring pattern are arranged such that any one of the first and second lines is located between the third and fourth lines and any one of the third and fourth lines is located between the first and second lines, the first or second line of the first wiring pattern and the third or fourth line of the second wiring pattern intersect with each other in a first intersection region, the first or second line of the first wiring pattern and the third or fourth line of the second wiring pattern intersect with each other in a second intersection region, one ends of the first and second lines are electrically connected to each other, the other ends of the first and second lines are electrically connected to each other, one ends of the third and fourth lines are electrically connected to each other, the other ends of the third and fourth lines are electrically connected to each other, a portion of the first or second line of the first wiring pattern positioned in the first intersection region is divided, a portion of the third or fourth line of the second wiring pattern positioned in the first intersection region passes through a portion in between divided portions of the first or second line of the first wiring pattern on the base insulating layer, one of the divided portions of the first or second line of the first wiring pattern is electrically connected to the connecting layer through the first through hole, and the other of the divided portions of the first or second line of the first wiring pattern is electrically connected to the connecting layer through the second through hole.

In the manufacturing method, the first and second lines of the first wiring pattern and the third and fourth lines of the second wiring pattern are arranged such that any one of the first and second lines is located between the third and fourth lines and any one of the third and fourth lines is located between the first and second lines. In this case, three side surfaces out of one side surface and the other side surface of the first line and one side surface and the other side surface of the second line are opposite to three side surfaces out of one side surface and the other side surface of the third line and one side surface and the other side surface of the fourth line, respectively. This increases an area in which the first wiring pattern and the second wiring pattern are opposite to each other, thus increasing capacitances of the first and second wiring patterns. This results in reduced characteristic impedances of the first and second wiring patterns.

The portion of the first or second line of the first wiring pattern is divided, and the portion of the third or fourth line of the second wiring pattern is arranged to pass through the portion in between the divided portions of the first or second line of the first wiring pattern in the first intersection region.

One of the divided portions of the first or second line of the first wiring pattern is electrically connected to the connecting layer through the first through hole of the cover insulating layer, and the other is electrically connected to the connecting layer through the second through hole of the cover insulating layer. In this case, the divided portions of the first or second line of the first wiring pattern are electrically connected to each other through the connecting layer.

This allows electrical connection of the first wiring pattern to be ensured and the first and second lines of the first wiring pattern and the third and fourth lines of the second wiring pattern to be arranged such that any one of the first and second lines is located between the third and fourth lines and any one of the third and fourth lines is located between the first and second lines with a simple configuration. Accordingly, the characteristic impedances of the first and second wiring patterns can be easily reduced at low cost.

According to the present invention, the area in which the first wiring pattern and the second wiring pattern are opposite to each other is increased, thus increasing the capacitances of the first and second wiring patterns. This results in reduced characteristic impedances of the first and second wiring patterns. In addition, electrical connection of the first wiring pattern can be ensured, and the first and second lines of the first wiring pattern and the third and fourth lines of the second wiring pattern are arranged such that any one of the first and second lines is located between the third and fourth lines and any one of the third and fourth lines is located between the first and second lines with a simple configuration. Accordingly, the characteristic impedances of the first and second wiring patterns can be easily reduced at low cost.

Other features, elements, characteristics, and advantages of the present invention will become more apparent from the following description of preferred embodiments of the present invention with reference to the attached drawings.

BRIEF DESCRIPTION OF THE DRAWINGS

FIG. 3 is a schematic sectional view of part of the write wiring patterns.

FIG. 6 is a diagram for explaining characteristic impedances of the write wiring patterns.

DESCRIPTION OF THE PREFERRED EMBODIMENTS

Figure 1:
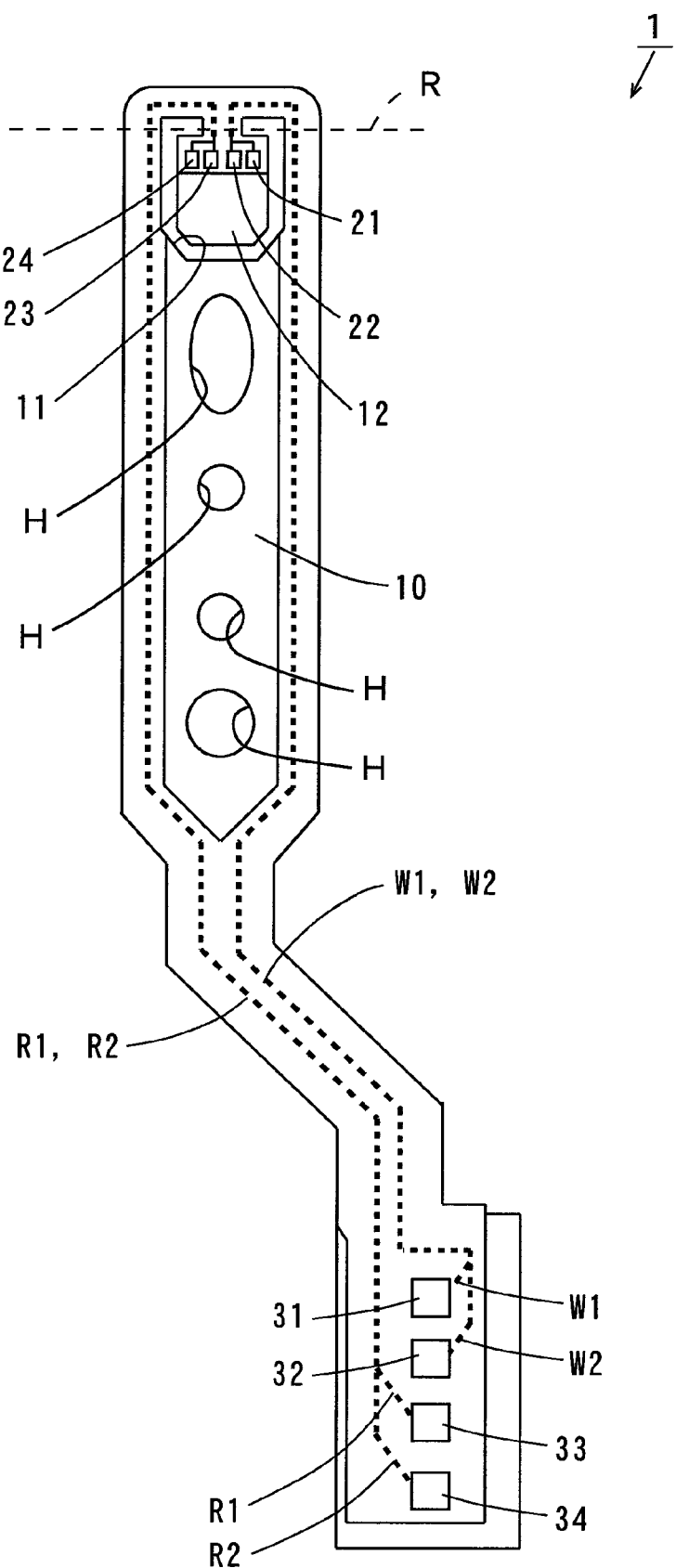
FIG. 1 is a plan view of a suspension board according to one embodiment of the present invention.

Hereinafter, a printed circuit board and a method of manufacturing the same according to one embodiment of the present invention will be described while referring to the drawings. Description will be made of the configuration and manufacturing method of a suspension board used in an actuator of a hard disk drive as the printed circuit board according to the one embodiment of the present invention.

(1) Configuration of the Suspension Board

FIG. 1 is a top view of the suspension board according to the one embodiment of the present invention. As shown in FIG. 1, the suspension board 1 includes a suspension body 10 formed of a long-sized metal substrate. Write wiring patterns W1, W2 and read wiring patterns R1, R2 are formed on the suspension body 10 as indicated by the bold dotted lines. The write wiring pattern W1 and the write wiring pattern W2 constitute a signal line pair. The read wiring pattern R1 and the read wiring pattern R2 constitute a signal line pair.

At an end of the suspension body 10, a U-shaped opening 11 is formed to provide a magnetic head supporting portion (hereinafter referred to as a tongue) 12. The tongue 12 is bent along the broken line R to form a predetermined angle with respect to the suspension body 10. Four electrode pads 21, 22, 23, 24 are formed at an end of the tongue 12.

Four electrode pads 31, 32, 33, 34 are formed at the other end of the suspension body 10. The electrode pads 21 to 24 on the tongue 12 and the electrode pads 31 to 34 at the other end of the suspension body 10 are electrically connected to one another through the write wiring patterns W1, W2 and the read wiring patterns R1, R2, respectively. A plurality of holes H are formed in the suspension body 10.

In the hard disk, which is not shown, including the suspension board 1, a current flows through the pair of write wiring patterns W1, W2 at the time of writing information in the magnetic disk. Moreover, the current flows through the pair of read wiring patterns R1, R2 at the time of reading information from the magnetic disk.

(2) The Write Wiring Patterns

Figure 2:
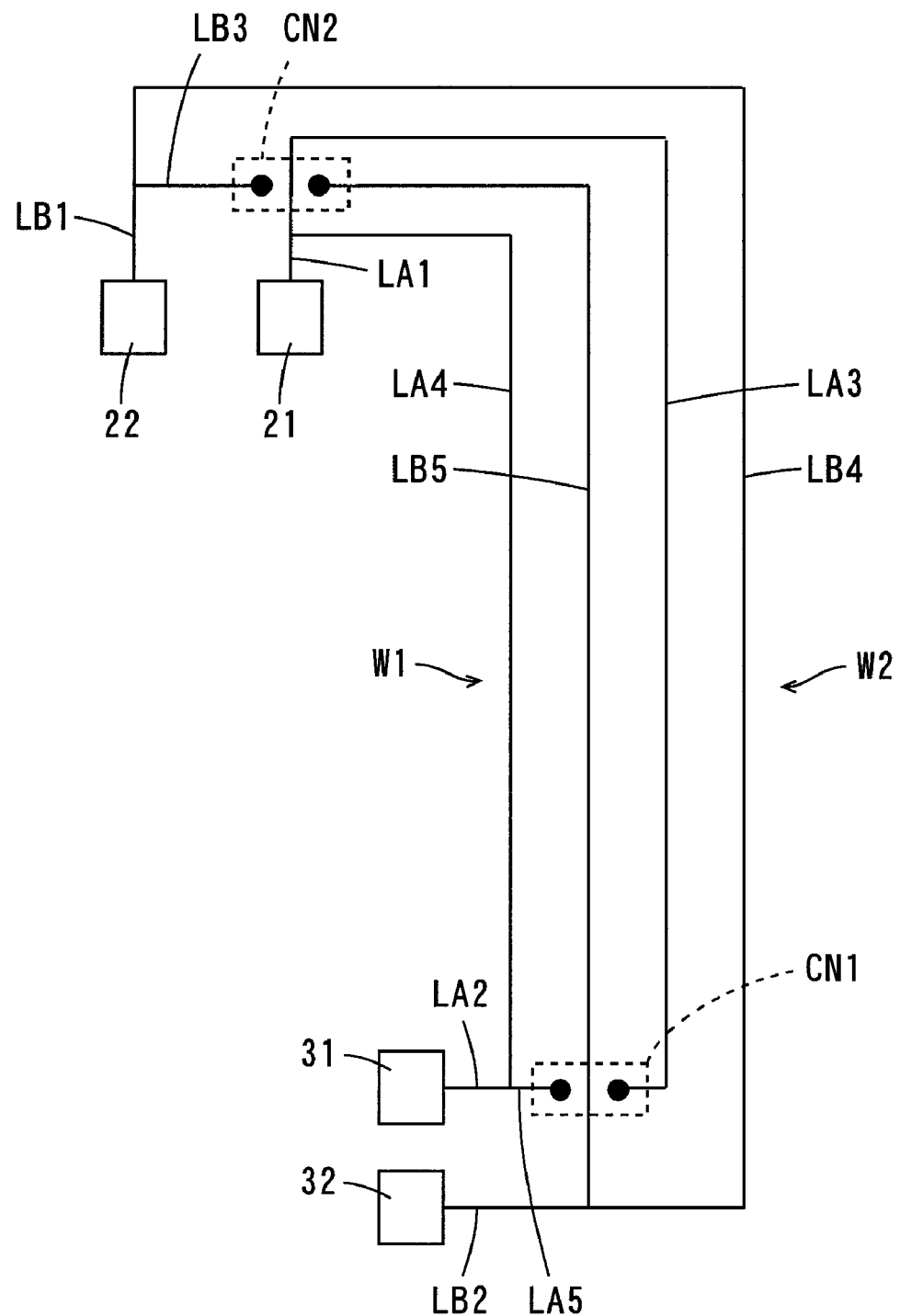
FIG. 2 is a schematic diagram showing the configurations of write wiring patterns.

Next, detail description will be made of the configurations of the write wiring patterns W1, W2. FIG. 2 is a schematic diagram showing the configurations of the write wiring patterns W1, W2.

As shown in FIG. 2, the write wiring pattern W1 is constituted by lines LA1 to LA5. The line LA1 is connected to the electrode pad 21, and the line LA2 is connected to the electrode pad 31.

One ends of the lines LA3, LA4 are integrated with the line LA1. The other end of the line LA3 and an end of the line LA5 are electrically connected to each other in an intersection region CN1. Details of the intersection region CN1 will be described later. The other ends of the lines LA4, LA5 are integrated with the line LA2.

The write wiring pattern W2 is constituted by lines LB1 to LB5. The line LB1 is connected to the electrode pad 22, and the line LB2 is connected to the electrode pad 32. One ends of the lines LB3, LB4 are integrated with the line LB1. The other end of the line LB3 and one end of the line LB5 are electrically connected to each other in an intersection region CN2. Details of the intersection region CN2 will be described later. The other ends of the lines LB4, LB5 are integrated with the line LB2.

The lines LA3, LA4 of the write wiring pattern W1 and the lines LB4, LB5 of the write wiring pattern W2 are arranged such that the line LA3 is located between the lines LB4, LB5 and the line LB5 is located between the lines LA3, LA4 while the lines LA3, LA4 and the lines LB4, LB5 are arranged in parallel with one another. The line LA3 of the write wiring pattern W1 extends to pass through a portion in between the ends of the lines LB3, LB5 of the write wiring pattern W2 in the intersection region CN2, and the line LB5 of the write wiring pattern W2 extends to pass through a portion in between the ends of the lines LA3, LA5 of the write wiring pattern W1 in the intersection region CN1.

FIG. 3 is a schematic sectional view of the lines LA3, LA4, LB4, LB5 of the write wiring patterns W1, W2 and the periphery thereof.

As shown in FIG. 3, a base insulating layer 41 is formed on the suspension body 10. The lines LA3, LA4, LB4, LB5 of the write wiring patterns W1, W2 are formed on the base insulating layer 41. A cover insulating layer 42 is formed on the base insulating layer 41 to cover the write wiring patterns W1, W2.

Figure 4:
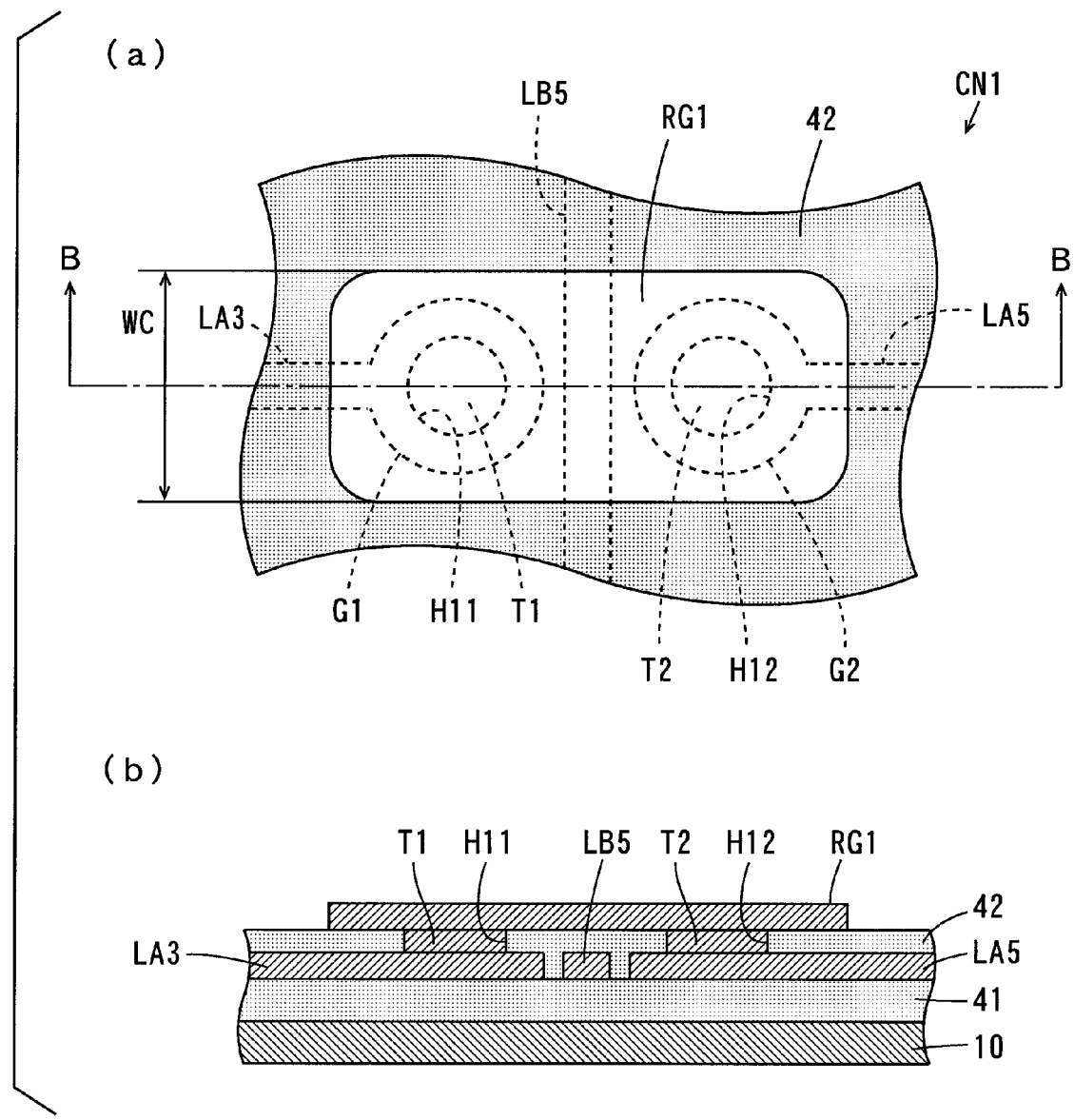
FIG. 4 is a plan view and a sectional view showing details of an intersection region of FIG. 2.

FIG. 4(a) is a plan view showing details of the intersection region CN1 of FIG. 2, and FIG. 4(b) is a sectional view taken along the line B-B of FIG. 4(a).

As shown in FIGS. 4(a) and (b), the end of the line LA3 and the end of the line LA5 are arranged on both sides of the line LB5. Circular connection portions G1, G2 are provided at the ends of the line LA3 and the line LA5, respectively. Through holes H11, H12 are formed in portions of the cover insulating layer 42 above the connection portions G1, G2, respectively. Connecting layers T1, T2 made of copper, for example, are formed to fill the through holes H11, H12 of the cover insulating layer 42, respectively. A substantially rectangular connecting layer RG1 made of copper, for example, is formed to integrally cover upper ends of the connecting layers T1, T2. This causes the lines LA3, LA5 to be electrically connected to each other through the connecting layers T1, T2, RG1.

The diameter of the connection portion G1 is preferably larger than the width of the line LA3, and the diameter of the connection portion G2 is preferably larger than the width of the line LA5. The diameter in the transverse cross section of the connecting layer T1 (the through hole H11) is preferably larger than the width of the line LA3, and the diameter in the transverse cross section of the connecting layer T2 (the through hole H12) is preferably larger than the width of the line LA5. Accordingly, the electrical connection between the lines LA3, LA5 is sufficiently ensured.

The width WC of the connecting layer RG1 is preferably constant in its portion between the connecting layers T1, T2. In the case, the transmission loss in the connecting layer RG1 is decreased.

The shape of each of the connection portions G1, G2 is not limited to the circular shape. For example, another shape such as an elliptical shape, a triangular shape, a quadrangular shape and a shape of a sector may be employed. The transverse cross sectional shape of each of the connecting layers T1, T2 (the through holes H11, H12) may be another shape such as an elliptical shape, a triangular shape, a quadrangular shape and a shape of a sector.

Note that the intersection region CN2 has the same configuration as the intersection region CN1. That is, the lines LB3, LB5 are electrically connected to each other through the connecting layers T1, T2, RG1.

Figure 5:
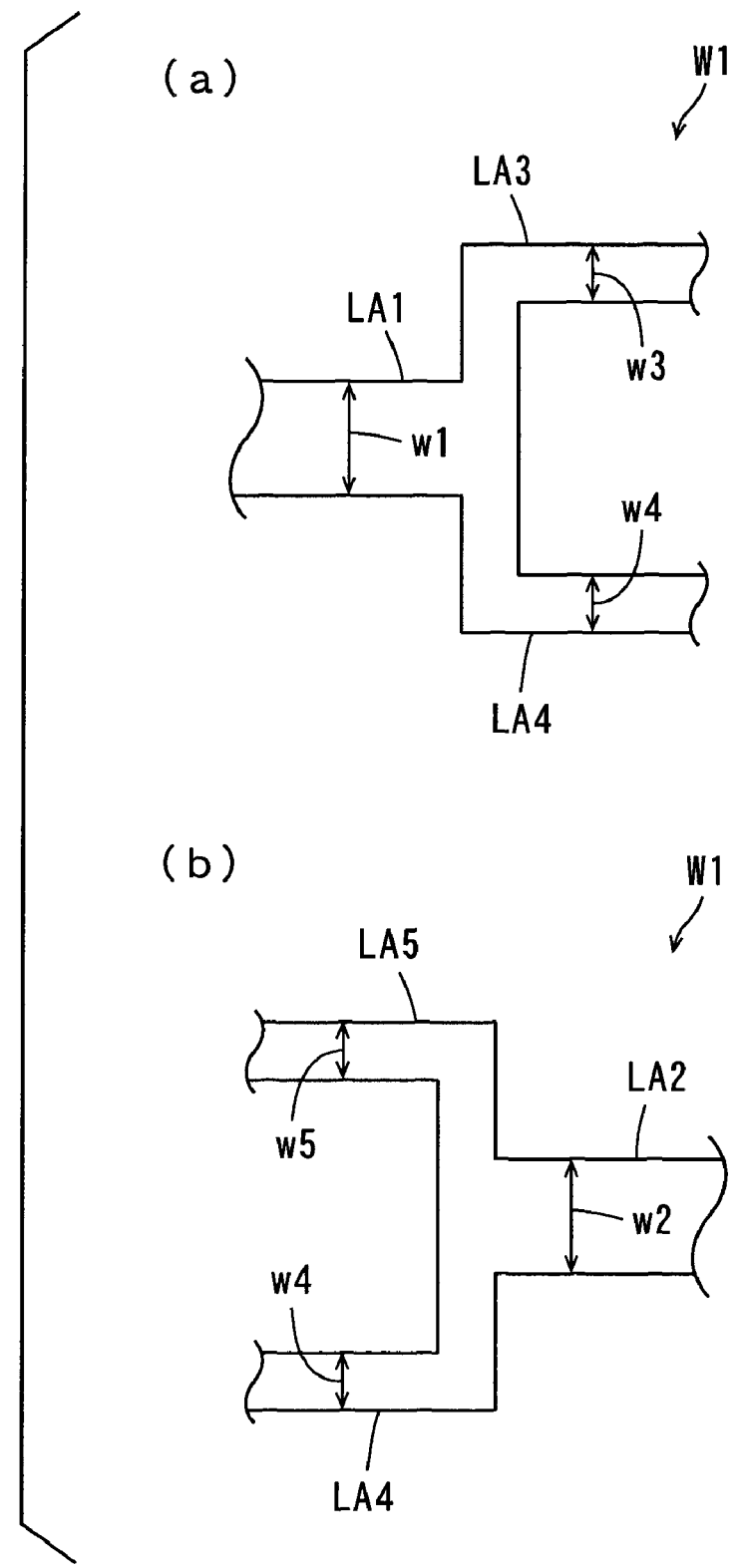
FIG. 5 is a plan view schematically showing linked portions of lines of the write wiring pattern.

Next, description is made of the width of each of the lines constituting the write wiring patterns W1, W2. FIG. 5(a) schematically shows a linked portion of the lines LA1, LA3, LA4 of the write wiring pattern W1, and FIG. 5(b) schematically shows a linked portion of the lines LA2, LA4, LA5.

As shown in FIGS. 5(a) and (b), the widths w1, w2 of the lines LA1, LA2 of the write wiring pattern W1 are equal to each other. The lines LA3, LA4, LA5 have equal widths w3, w4, w5, each of which is smaller than each of the widths w1, w2 of the lines LA1, LA2.

Each of the widths w3, w4, w5 of the lines LA3, LA4, LA5 is preferably half each of the widths w1, w2 of the lines LA1, LA2. In this case, the characteristic impedances of the lines LA3, LA4 are substantially equal to the characteristic impedance of the line LA1, and the characteristic impedances of the lines LA4, LA5 are substantially equal to the characteristic impedance of the line LA2. This reduces the transmission loss in the write wiring pattern W1.

Similarly, the widths of the lines LB1, LB2 of the write wiring pattern W2 are equal to each other. The lines LB3, LB4, LB5 have equal widths, each of which is smaller than the width of each of the lines LB1, LB2.

The width of each of the lines LB3, LB4, LB5 is preferably half the width of each of the lines LB1, LB2. In this case, the characteristic impedances of the lines LB3, LB4 are substantially equal to the characteristic impedance of the line LB1, and the characteristic impedances of the lines LB4, LB5 are substantially equal to the characteristic impedance of the line LB2. This reduces the transmission loss in the write wiring pattern W2.

(3) The Characteristic Impedances of the Write Wiring Patterns W1, W2

As described above, the lines LA3, LA4 constituting the write wiring pattern W1 and the lines LB4, LB5 constituting the write wiring pattern W2 are arranged such that the line LA3 is located between the lines LB4, LB5 and the line LB5 is located between the lines LA3, LA4 while the lines LA3, LA4 and the lines LB4, LB5 are arranged in parallel with one another in the present embodiment. In this case, the characteristic impedances of the write wiring patterns W1, W2 can be decreased. The reason will be described with reference to FIG. 6.

FIG. 6(a) shows the lines LA3, LA4, LB4, LB5 of the write wiring patterns W1, W2 and the periphery thereof. FIG. 6(b) shows an example of the write wiring patterns W1, W2 each composed of one line.

The characteristic impedances of the write wiring patterns W1, W2 are decreased with increasing the capacitances of the write wiring patterns W1, W2. The capacitances are increased with increasing the area in which the write wiring pattern W1 and the write wiring pattern W2 are opposite to each other.

That is, the characteristic impedances of the write wiring patterns W1, W2 are decreased with increasing the area in which the write wiring pattern W1 and the write wiring pattern W2 are opposite to each other.

In the configuration shown in FIG. 6(a), one side surface of the line LA4 of the write wiring pattern W1 and one side surface of the line LB5 of the write wiring pattern W2 are opposite to each other, the other side surface of the line LB5 of the write wiring pattern W2 and one side surface of the line LA3 of the write wiring pattern W1 are opposite to each other, and the other side surface of the line LA3 of the write wiring pattern W1 and one side surface of the line LB4 of the write wiring pattern W2 are opposite to each other. The total of the opposite areas corresponds to the area in which the write wiring pattern W1 and the write wiring pattern W2 are opposite to each other.

On the other hand, in the configuration shown in FIG. 6(b), only one side surface of the one line of the write wiring pattern W1 and one side surface of the one line of the write wiring pattern W2 are opposite to each other. The opposite area corresponds to the area in which the write wiring pattern W1 and the write wiring pattern W2 are opposite to each other.

Accordingly, the lines LA3, LA4 constituting the write wiring pattern W1 and the lines LB4, LB5 constituting the write wiring pattern W2 are arranged such that the line LA3 is located between the lines LB4, LB5 and the line LB5 is located between the lines LA3, LA4 while the lines LA3, LA4 and the lines LB4, LB5 are arranged in parallel with one another to cause the characteristic impedances of the write wiring patterns W1, W2 to be reduced as compared with the case where the write wiring patterns W1, W2 are each composed of the one line.

Moreover, the suspension body 10 is provided to be opposite to the write wiring patterns W1, W2 with the base insulating layer 41 sandwiched therebetween in the present embodiment, thus further increasing the capacitances of the write wiring patterns W1, W2. This results in the further reduced characteristic impedances of the write wiring patterns W1, W2.

(4) Method of Manufacturing the Suspension Board

Figure 7:
FIG. 7 is a vertical sectional view showing steps of manufacturing the suspension board.
Figure 7:
Figure 7:
Figure 7:
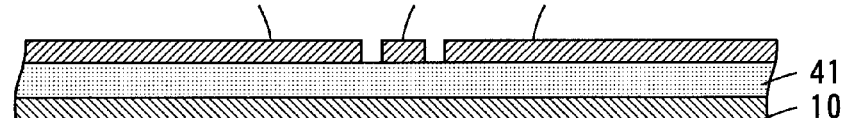
Figure 7:
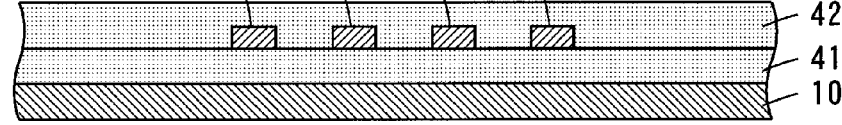
Figure 7:
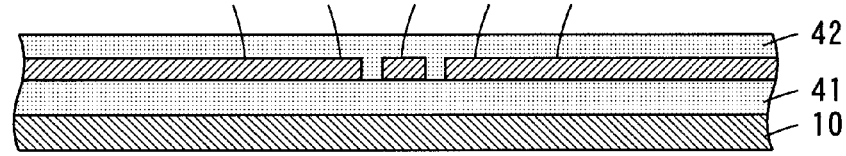
Figure 8:
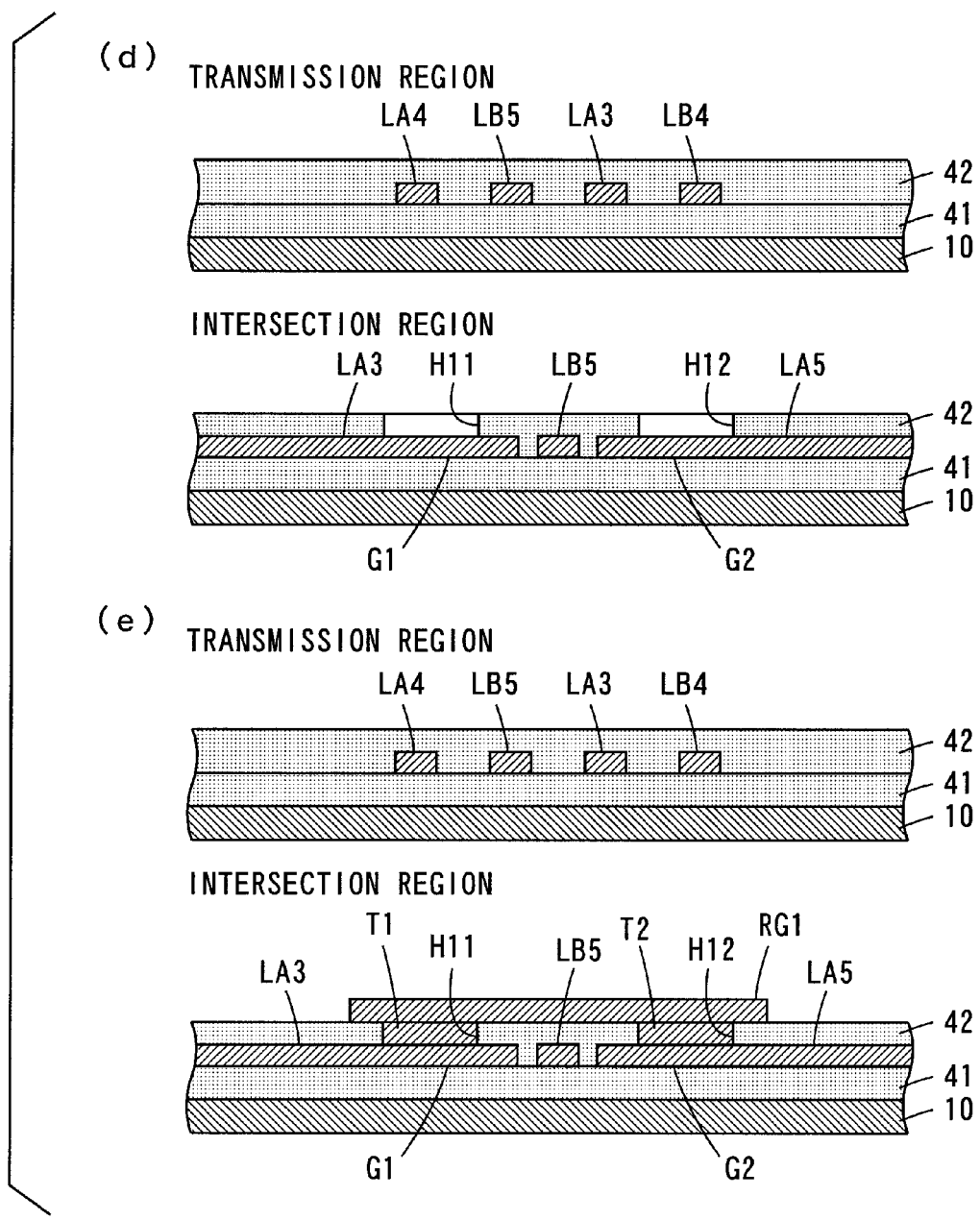
FIG. 8 is a vertical sectional view showing steps of manufacturing the suspension board.

Next, description is made of the method of manufacturing the suspension board 1. FIGS. 7 and 8 are vertical sectional views showing steps of manufacturing the suspension board 1. Here, description is made of steps of manufacturing the lines LA3, LA4, LB4, LB5 of the write wiring patterns W1, W2 and the periphery thereof (hereinafter referred to as a transmission region) shown in FIG. 3 and steps of manufacturing the intersection region CN1 shown in FIG. 4. Upper stages of FIG. 7(a) to FIG. 8(e) show the steps of manufacturing the transmission region, and lower stages show the steps of manufacturing the intersection region CN1.

First, the base insulating layer 41 made of polyimide, for example, is laminated on the suspension body 10 of stainless steel, for example, using an adhesive as shown in FIG. 7(a).

The thickness of the suspension body 10 is not less than 5 µm and not more than 50 µm, for example, and preferably not less than 10 µm and not more than 30 µm. Instead of stainless steel, another metal such as aluminum or an alloy, for example, may be used as the suspension body 10.

The thickness of the base insulating layer 41 is not less than 1 µm and not more than 15 µm, for example, and preferably not less than 2 µm and not more than 12 µm. Instead of polyimide, another insulating material such as epoxy resin may be used as the base insulating layer 41.

The write wiring patterns W1, W2 made of copper, for example, are subsequently formed on the base insulating layer 41 as shown in FIG. 7(b). In the transmission region, the lines LA3, LA4 as the write wiring pattern W1 and the lines LB4, LB5 as the write wiring pattern W2 are arranged such that the line LA3 is located between the lines LB4, LB5 and the line LB5 is located between the lines LA3, LA4 while the lines LA3, LA4 and the lines LB4, LB5 are arranged in parallel with one another.

The lines LA3, LA5 as the write wiring pattern W1 and the line LB5 as the write wiring pattern W2 are formed in the intersection region CN1. The connection portions G1, G2 are formed at the ends of the lines LA3, LA5. The diameter of each of the connection portions G1, G2 is not less than 30 µm and not more than 300 µm, for example, and preferably not less than 50 82 m and not more than 150 µm.

The write wiring patterns W1, W2 may be formed using a semi-additive method, for example, and may be formed using another method such as a subtractive method.

The thickness of each of the write wiring patterns W1, W2 is not less than 3 µm and not more than 16 µm, for example, and preferably not less than 6 µm and not more than 13 µm. The width of each of the lines LA1, LA2, LB1, LB2 of the write wiring patterns W1, W2 is not less than 20 µm and not more than 200 µm, for example, and preferably not less than 30 µm and not more than 100 µm. The width of each of the lines LA3 to LA5, LB3 to LB5 is not less than 10 µm and not more than 150 µm, for example, and preferably not less than 12 µm and not more than 80 µm.

The material for the write wiring patterns W1, W2 is not limited to copper. For example, another metal such as gold (Au) and aluminum or an alloy such as a copper alloy and an aluminum alloy may be used.

Next, the cover insulating layer 42 made of polyimide, for example, is formed on the base insulating layer 41 to cover the write wiring patterns W1, W2 as shown in FIG. 7(c). The thickness of a portion of the cover insulating layer 42 above the write wiring patterns W1, W2 is not less than 4 µm and not more than 26 µm, for example, and preferably not less than 5 µm and not more than 21 µm. Instead of polyimide resin, another insulating material such as epoxy resin may be used as the cover insulating layer 42.

In the intersection region CN1, the through holes H11, H12 are then formed by etching using a laser or wet etching, for example, in the portions of the cover insulating layer 42 above the connection portions G1, G2 of the lines LA3, LA5 as shown in FIG. 8(d). The diameter of each of the through holes H11, H12 is not less than 20 µm and not more than 200 µm, for example, and preferably not less than 40 µm and not more than 100 µm.

The connecting layers T1, T2 made of copper, for example, are formed to fill the through holes H11, H12 of the cover insulating layer 42 and the substantially rectangular connecting layer RG1 made of copper, for example, is formed to integrally cover the upper ends of the connecting layers T1, T2 in the intersection region CN1 as shown in FIG. 8(e). The area of the connecting layer RG1 is not less than 3200 µm$^2$ and not more than 180000 µm$^2$, for example, and preferably not less than 5000 µm$^2$ and not more than 80000 µm$^2$.

The material for the connecting layers T1, T2, RG1 is not limited to copper. For example, another metal such as gold (Au) and aluminum or an alloy such as a copper alloy and an aluminum alloy may be used.

In this manner, the suspension board 1 is completed.

(5) Effects

In the suspension board 1 according to the present embodiment, the lines LA3, LA4 constituting the write wiring pattern W1 and the lines LB4, LB5 constituting the write wiring pattern W2 are arranged such that the line LA3 is located between the lines LB4, LB5 and the line LB5 is located between the lines LA3, LA4 while the lines LA3, LA4 and the lines LB4, LB5 are arranged in parallel with one another in the same plane. This reduces the characteristic impedances of the write wiring patterns W1, W2.

The suspension body 10 is opposite to the lines LA3, LA4, LB4, LB5 with the base insulating layer 41 sandwiched therebetween, thus further decreasing the characteristic impedances of the write wiring patterns W1, W2.

Moreover, the lines LA3, LA5 of the write wiring pattern W1 are electrically connected to each other through the connecting layers T1, T2, RG1 in the intersection region CN1, and the lines LB3, LB5 of the write wiring pattern W2 are electrically connected to each other through the connecting layers T1, T2, RG1 in the intersection region CN2 in the present embodiment.

In this case, the line LB5 of the write wiring pattern W2 can be arranged to pass through the portion in between the lines LA3, LA5 of the write wiring pattern W1, and the line LA3 of the write wiring pattern W1 can be arranged to pass through the portion in between the lines LB3, LB5 of the write wiring pattern W2. Therefore, the lines LA3, LA4 of the write wiring pattern W1 and the lines LB4, LB5 of the write wiring pattern W2 can be arranged such that the line LA3 is located between the lines LB4, LB5 and the line LB5 is located between the lines LA3, LA4 while the lines LA3, LA4 and the lines LB4, LB5 are arranged in parallel with one another. Accordingly, the electrical connection between the electrode pads 21, 31 and between the electrode pads 22, 32 can be ensured and the characteristic impedances of the write wiring patterns W1, W2 can be decreased with the simple configuration.

Since the intersection region CN1 and the intersection region CN2 have the same configuration, the transmission loss in the intersection region CN1 and the transmission loss in the intersection region CN2 are substantially equal to each other. This does not cause the transmission characteristics of the write wiring pattern W1 to be greatly different from the transmission characteristics of the write wiring pattern W2. As a result, an operation of writing in the magnetic disk can be appropriately performed.

(6) INVENTIVE EXAMPLE AND COMPARATIVE EXAMPLES

(6-1) INVENTIVE EXAMPLE

The suspension board 1 shown in FIGS. 1 to 5 was manufactured as an inventive example. Stainless steel was used as the material of the suspension body 10, polyimide was used as the material of the base insulating layer 41 and the cover insulating layer 42, and copper was used as the material of the write wiring patterns W1, W2. The thickness of the suspension body 10 was 20 μm, the thickness of the base insulating layer 41 was 10 μm, the thickness of each of the write wiring patterns W1, W2 was 12 μm, and the thickness of the portion of the cover insulating layer 42 above the write wiring patterns W1, W2 was 5 μm.

The widths of the lines LA3 to LA5, LB3 to LB5 of the write wiring patterns W1, W2 were set to be equal to one another in a range from 15 μm to 100 μm, and the width of each of the lines LA1, LA2, LB1, LB2 was twice as wide as the width of each of the lines LA3 to LA5, LB3 to LB5. In addition, each of intervals between the lines LA3, LA4, LB4, LB5 in the transmission region was 15 μm.

The diameter of each of the through holes H11, H12 of the cover insulating layer 42 was 80 μm, and the diameter of each of the connection portions G1, G2 of the lines LA3, LA5, LB3, LB5 was 140 μm in the intersection regions CN1, CN2.

(6-2) COMPARATIVE EXAMPLE 1

A suspension board of a comparative example 1 is different from the suspension board 1 of the inventive example in that the write wiring patterns W1, W2 are each composed of one line (see FIG. 6(b)). Note that the widths of the write wiring patterns W1, W2 were set to be equal to each other in a range from 15 μm to 100 μm.

(6-3) COMPARATIVE EXAMPLE 2

A suspension board of a comparative example 2 is different from the suspension board 1 of the inventive example in that the suspension body 10 is not provided in the transmission region.

(6-4) Evaluation

Figure 9:
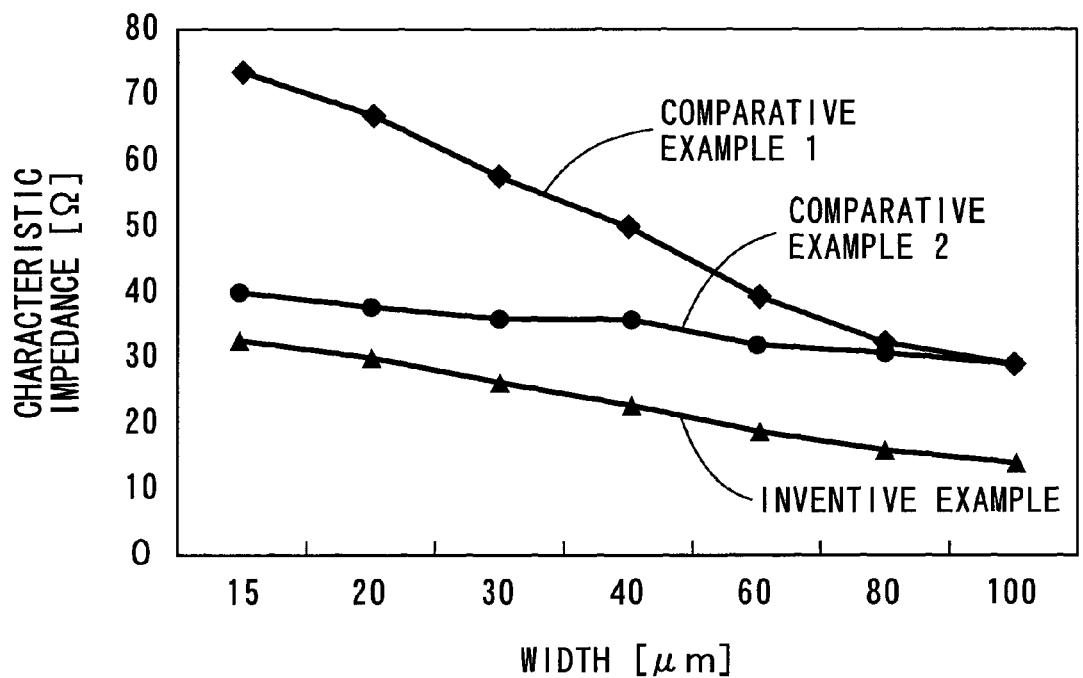
FIG. 9 is a diagram showing results of measurement of the characteristic impedances of the write wiring patterns.

The characteristic impedances of the write wiring patterns W1, W2 were measured in the inventive example and the comparative examples 1,2. The results are shown in FIG. 9. In FIG. 9, the abscissa indicates the width of each of the write wiring patterns W1, W2. In this case, the abscissa indicates the width of each of the lines LA3 to LA5, LB3 to LB5 in the inventive example and the comparative example 2, and indicates the width of the one line of each of the write wiring patterns W1, W2 in the comparative example 1. The ordinate indicates the characteristic impedances of the write wiring patterns W1, W2.

As shown in FIG. 9, the characteristic impedances of the write wiring patterns W1, W2 in the inventive example were smaller than the characteristic impedances of the write wiring patterns W1, W2 in the comparative examples 1, 2.

The results show that the lines LA3, LA4 constituting the write wiring pattern W1 and the lines LB4, LB5 constituting the write wiring pattern W2 were arranged such that the line LA3 was located between the lines LB4, LB5 and the line LB5 was located between the lines LA3, LA4 while the lines LA3, LA4 and the lines LB4, LB5 were arranged in parallel with one another to cause the characteristic impedances of the write wiring patterns W1, W2 to be reduced as compared with the case where the write wiring patterns W1, W2 were each composed of the one line.

In addition, it was found that the suspension body 10 was provided to be opposite to the lines LA3, LA4, LB4, LB5 in the transmission region to cause the characteristic impedances of the write wiring patterns W1, W2 to be reduced.

Moreover, the results show that the lines LA3, LA5 of the write wiring pattern W1 were electrically connected to each other and the lines LB3, LB5 of the write wiring pattern W2 were electrically connected to each other in the intersection regions CN1, CN2, so that the electrical connection between the electrode pads 21, 31 and between the electrode pads 22, 32 is ensured.

(7) Other Embodiments

The configurations of the write wiring patterns W1, W2, the positions of the intersection regions and so on may be suitably changed according to the positions of the electrode pads 21, 22, 31, 32, and so on.

Figure 10:
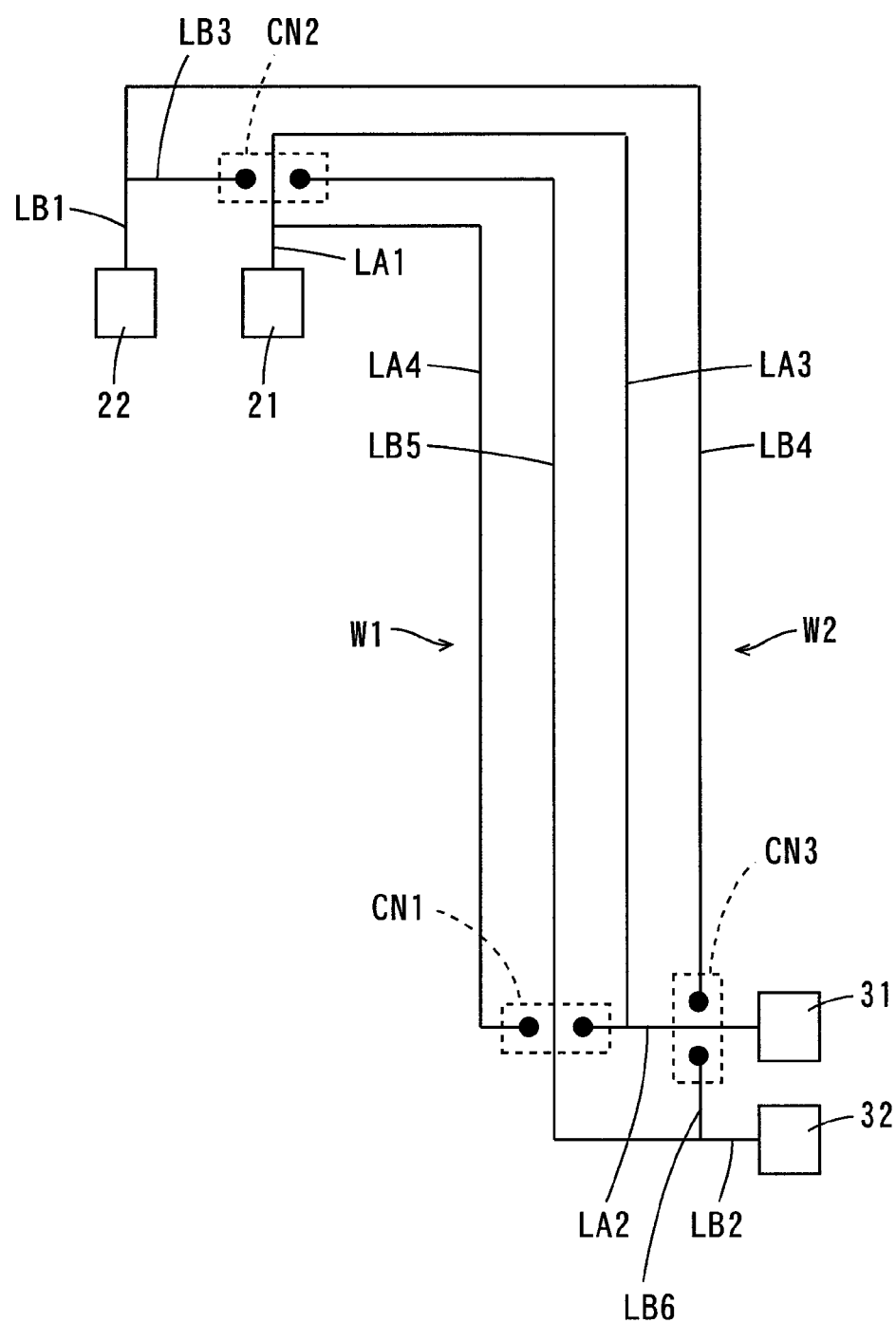
FIG. 10 is a diagram showing another example of the configurations of the write wiring patterns.
Figure 11:
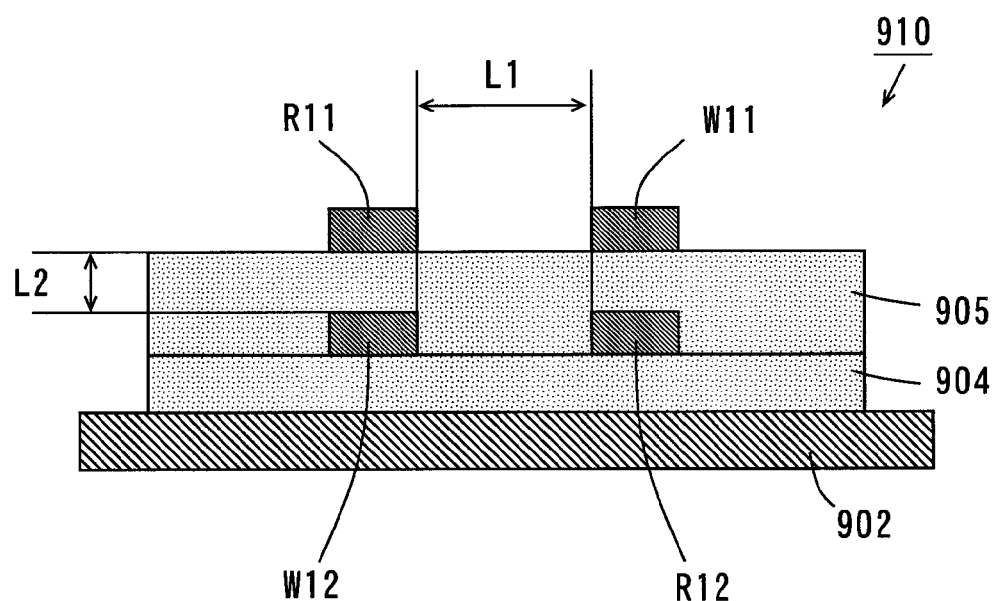
FIG. 11 is a vertical sectional view of a conventional suspension board.

FIG. 10 is a diagram showing another example of the configurations of the write wiring patterns W1, W2. In the example of FIG. 10, the line LB4 of the write wiring pattern W2 is electrically connected to a line LB6 through an intersection region CN3. The intersection region CN3 has the same configuration as the intersection regions CN1, CN2. The line LB6 is integrated with the line LB2. The line LA2 of the write wiring pattern W1 is connected to the line LA3, and arranged to pass through a portion in between the line LB4 and the line LB6 of the write wiring pattern W2.

Also in this case, the electrical connection between the electrode pads 21, 31 and between the electrode pads 22, 32 can be ensured and the characteristic impedances of the write wiring patterns W1, W2 can be decreased.

(8) Correspondences between Elements in the Claims and Parts in Embodiments

In the following paragraphs, non-limiting examples of correspondences between various elements recited in the claims below and those described above with respect to various preferred embodiments of the present invention are explained.

In the foregoing embodiments, the write wiring pattern W1 is an example of a first wiring pattern, the write wiring pattern W2 is an example of a second wiring pattern, and the cover insulating layer 42 is an example of first and second cover portions.

The lines LA3, LA5 are examples of a first line, the line LA4 is an example of a second line, the lines LB3, LB5 are examples of a third line, the line LB4 is an example of a fourth line, the line LA1 is an example of a fifth line, the line LA2 is an example of a sixth line, the line LB1 is an example of a seventh line, the line LB2 is an example of an eighth line, the intersection region CN1 is an example of a first intersection region, the intersection region CN2 is an example of a second intersection region, the through hole H11 is an example of first and third through holes, and the through hole H12 is an example of second and forth through holes.

As each of various elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:
1. A printed circuit board comprising:
a base insulating layer;
first and second wiring patterns that are formed on said base insulating layer and constitute a signal line pair;

a cover insulating layer formed on said base insulating layer to cover at least part of said first and second wiring patterns; and a connecting layer provided on said cover insulating layer, wherein said first wiring pattern has first and second lines, said second wiring pattern has third and fourth lines, one ends of said first and second lines are electrically connected to each other and the other ends of said first and second lines are electrically connected to each other, one ends of said third and fourth lines are electrically connected to each other and the other ends of said third and fourth lines are electrically connected to each other, said first and second lines of said first wiring pattern and said third and fourth lines of said second wiring pattern are arranged such that any one of said first and second lines is located between said third and fourth lines and any one of said third and fourth lines is located between said first and second lines, a first intersection region in which said first or second line of said first wiring pattern and said third or fourth line of said second wiring pattern intersect with each other is provided, a second intersection region in which said first or second line of said first wiring pattern and said third or fourth line of said second wiring pattern intersect with each other is provided, a portion of said first or second line of said first wiring pattern positioned in said first intersection region is divided, a portion of said third or fourth line of said second wiring pattern positioned in said first intersection region is arranged on said base insulating layer to pass through a portion in between divided portions of said first or second line of the first wiring pattern, said cover insulating layer includes a first cover portion that has first and second through holes and is provided to cover said first and second wiring patterns in said first intersection region, said connecting layer includes a first connecting layer provided on said first cover portion, one of said divided portions of said first or second line of the first wiring pattern is electrically connected to said first connecting layer through said first through hole of said first cover portion, and the other of said divided portions of said first or second line of the first wiring pattern is electrically connected to said first connecting layer through said second through hole of said first cover portion.

2. The printed circuit board according to claim 1, wherein said cover insulating layer includes a second cover portion that has third and fourth through holes and is provided to cover said first and second wiring patterns in said second intersection region, said connecting layer further includes a second connecting layer provided on said second cover portion, a portion of said third or fourth line of said second wiring pattern positioned in said second intersection region is divided, a portion of said first or second line of said first wiring pattern positioned in said second intersection region is arranged on said base insulating layer to pass through a portion in between divided portions of said third or fourth line of said second wiring pattern, one of said divided portions of said third or fourth line of said second wiring pattern is electrically connected to said second connecting layer through said third through hole of said second cover portion, and the other of said divided portions of said third or fourth line of said second wiring pattern is electrically connected to said second connecting layer through said fourth through hole of said second cover portion.

3. The printed circuit board according to claim 1, further comprising:

a fifth line branched from the one end of said first line or the one end of said second line;

a sixth line branched from the other end of said first line or the other end of said second line;

a seventh line branched from the one end of said third line or the one end of said fourth line; and an eighth line branched from the other end of said third line or the other end of said fourth line, wherein a width of each of said fifth line and said sixth line is obtained by adding a width of said first line and a width of said second line, and a width of each of said seventh line and said eighth line is obtained by adding a width of said third line and a width of said fourth line.

4. A method of manufacturing a printed circuit board comprising the steps of:

forming first and second wiring patterns constituting a signal line pair on a base insulating layer;

forming a cover insulating layer having first and second through holes on said base insulating layer to cover said first and second wiring patterns in a first intersection region; and forming a connecting layer on said cover insulating layer, wherein the step of forming said first and second wiring patterns includes the step of forming said first and second wiring patterns on said base insulating layer such that said first wiring pattern is composed of first and second lines and said second wiring pattern is composed of third and fourth lines, said first and second lines of said first wiring pattern and said third and fourth lines of said second wiring pattern are arranged such that any one of said first and second lines is located between said third and fourth lines and any one of said third and fourth lines is located between said first and second lines, said first or second line of said first wiring pattern and said third or fourth line of said second wiring pattern intersect with each other in a first intersection region, and said first or second line of said first wiring pattern and said third or fourth line of said second wiring pattern intersect with each other in a second intersection region, one ends of said first and second lines are electrically connected to each other, the other ends of said first and second lines are electrically connected to each other, one ends of said third and fourth lines are electrically connected to each other, the other ends of said third and fourth lines are electrically connected to each other, a portion of said first or second line of said first wiring pattern positioned in said first intersection region is divided, a portion of said third or fourth line of said second wiring pattern positioned in said first intersection region passes through a portion in between divided portions of said first or second line of said first wiring pattern on said base insulating layer, one of said divided portions of said first or second line of said first wiring pattern is electrically connected to said connecting layer through said first through hole, and the other of said divided portions of said first or second line of said first wiring pattern is electrically connected to said connecting layer through said second through hole.

* * * * *